(12) United States Patent
Bosselmann et al.

(10) Patent No.: US 6,392,583 B1
(45) Date of Patent: May 21, 2002

(54) METHOD AND CONFIGURATION FOR PROCESSING AT LEAST ONE ANALOG SIGNAL CONTAINING A NUMBER OF FREQUENCY RANGES

(75) Inventors: Thomas Bosselmann, Marloffstein; Peter Menke, Pretzfeld; Stephan Mohr, Jena; Michael Willsch, Fürth; Mario Wollenhaupt, Westgreusen, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/677,544

(22) Filed: Oct. 2, 2000

Related U.S. Application Data

(63) Continuation of application No. PCT/DE99/00911, filed on Mar. 25, 1999.

(30) Foreign Application Priority Data

Mar. 31, 1998 (DE) .......................... 198 14 372
Jul. 10, 1998 (DE) .......................... 198 30 987

(51) Int. Cl.⁷ .............................. H03M 5/00
(52) U.S. Cl. .................. 341/155; 341/118; 341/126
(58) Field of Search ................ 341/155, 158, 341/159, 118, 137, 115, 116; 356/479; 328/163; 395/2.39

(56) References Cited

U.S. PATENT DOCUMENTS

| | | | |
|---|---|---|---|
| 5,347,464 A | | 9/1994 | McEachern et al. |
| 5,392,044 A | * | 2/1995 | Kotzin et al. ............... 341/155 |
| 5,402,124 A | * | 3/1995 | Todd et al. .................. 341/131 |
| 5,546,081 A | | 8/1996 | Baumgartl |
| 5,568,142 A | * | 10/1996 | Velazquez et al. .......... 341/126 |
| 5,646,569 A | | 7/1997 | Bruhns et al. |
| 6,177,893 B1 | * | 1/2001 | Velazquez et al. .......... 341/118 |

FOREIGN PATENT DOCUMENTS

| | | |
|---|---|---|
| DE | 28 31 407 C3 | 1/1980 |
| DE | 43 12 184 A1 | 10/1994 |
| DE | 44 36 454 A1 | 4/1996 |
| DE | 195 17 128 A1 | 11/1996 |
| DE | 196 01 727 C1 | 4/1997 |
| DE | 195 47 021 A1 | 6/1997 |
| DE | 196 08 944 A1 | 9/1997 |
| EP | 0 208 593 B1 | 1/1987 |
| EP | 0 444 233 A1 | 9/1991 |
| EP | 0 613 015 A1 | 8/1994 |
| EP | 0 657 740 A2 | 6/1995 |

OTHER PUBLICATIONS

International Publication No. WO 95/10046 (Bosselmann et al.), dated Apr. 13, 1995.
International Publication No. WO 91/12533 (Almström), dated Aug. 22, 1991.
"Vergleichende Darstellung verschiedener magnetooptischer Stromwandlerkonzepte" (Comparative illustration of different magneto–optical concepts for current transformers), (Bosselmann), Siemens AG, Zentrale Forschung und Entwicklung, ZFE BT 51, Erlangen.

* cited by examiner

*Primary Examiner*—Brian Young
*Assistant Examiner*—John Nguyen
(74) *Attorney, Agent, or Firm*—Herbert L. Lerner; Laurence A. Greenberg; Werner H. Stemer

(57) ABSTRACT

A method and a configuration are provided for digitally processing an analog signal, especially of output quantities of an optical transducer. The analog signal is divided into a number of partial analog signals having in each case different frequency ranges. The levels of the partial signals are adapted to the dynamic ranges of downstream digitizing device by analog amplification. This results in an improved signal-to-noise ratio.

22 Claims, 7 Drawing Sheets

METHOD AND CONFIGURATION FOR PROCESSING AT LEAST ONE ANALOG SIGNAL CONTAINING A NUMBER OF FREQUENCY RANGES

CROSS-REFERENCE TO RELATED APPLICATION

This is a continuation of copending International Application PCT/DE99/00911, filed Mar. 25, 1999, which designated the United States.

BACKGROUND OF THE INVENTION

FIELD OF THE INVENTION

The invention relates to a method and a configuration for processing at least one analog signal containing a number of frequency ranges.

In particular, the invention relates to a method and a configuration for processing output quantities of an optical transducer.

An optical transducer for acquiring an electrical quantity to be measured is known. This applies especially to the optical measurement of an electric current by utilizing the Faraday effect and also to the optical measurement of an electric voltage by utilizing the Pockels effect. A polarized light signal, the polarization of which changes under the influence of the electrical quantity to be measured, is launched into a sensor element (for example Faraday element or Pockels element) which is under the influence of the electrical quantity to be measured. The change in polarization is thus a measure of the quantity to be measured. Furthermore, an embodiment is known in which two polarized light signals having opposite directions of travel are launched into the sensor element. To analyze the change in polarization, each light signal is supplied to a (polarization) analyzer after passing at least once through the sensor element. The analyzer can divide the associated light signal either into two linearly polarized partial light signals having different planes of polarization which are generally perpendicular to one another (two-channel analysis) or pass only one light component projected onto a predetermined direction of polarization (single-channel analysis). From the light intensities of the two partial light signals or of the light component, corresponding electrical signals are generated, for example with the aid of photodiodes, from which a polarization signal is derived. The polarization signal is a measure of the change in polarization of the light signal in the sensor element under the influence of the alternating electrical quantity to be measured.

International Patent disclosure WO 95/10046 and German Patent DE 196 01 727 C1 disclose in the example of a magneto-optical current transducer how the polarization signal described can be calculated from two partial light signals LT1 and LT2 or, respectively, from the electrical (intensity) signals I1 and I2 determined from these. The polarization signal P is formed as quotient from a difference and the sum of the two electrical signals I1 and I2 as follows:

$$P = \frac{(I1 - I2)}{(I1 + I2)} \quad (1)$$

Neglecting interference, the polarization signal P is equal to:

$$P = \sin(2\rho) = \sin(2 \cdot N \cdot V \cdot I) \quad (2)$$

where ρ is the so-called Faraday angle of rotation. The Faraday angle of rotation ρ then corresponds to the angle through which the polarization of the light signal is rotated in the Faraday element due to the electrical current I to be detected. According to the relation:

$$\rho = 2 \cdot N \cdot V \cdot I \quad (3)$$

it is essentially directly proportional to the amplitude of the current I to be measured. In addition, in equation (3) N is the number of rotations of the light signal around a current conductor through which the current I to be measured flows, and V is the so-called Verdet constant V. The Verdet constant V is a parameter of the Faraday element which is generally dependent on the material and the temperature.

A limiting factor of the optical transducer described is the periodicity of the polarization dependent on the quantity to be measured. In the case of the Faraday effect, for example, the state of polarization is repeated after a 180° rotation of the linear input polarization. This initially results in a limited single-valued measuring range for the alternating electrical quantity to be detected.

If the sensitivity of the sensor is reduced in order to be able to map the largest possible signal amplitudes of the alternating electrical quantity within the limited measuring range, this is at the cost of smaller signal amplitudes which can then no longer be extracted from the noise. Conversely, an increase in sensitivity to achieve better acquisition of relatively small signal amplitudes has a negative effect on the maximum signal amplitude that can be mapped within the limited measuring range.

In the field of public electricity supply, a potential field of application of optical test methods inter alia due to the inherent high electromagnetic compatibility, it must be possible to cover a wide dynamic range of the alternating electrical quantity to be detected, especially of the electrical current. The demand for maximum measurement accuracy at low current amplitude is a prerequisite from the metering for invoicing. On the other hand, it must also be possible to reliably detect a very high current amplitude for the purpose of short-circuit current detection.

To meet the above requirements, a method has been developed which has a measuring range that is mainly extended upward. Published, European Patent Application EP 0 613 015 A1 discloses an electro-optical voltage transducer, the measuring range of which extends beyond the single-valued range of the first period. In this configuration two optical light signals are analyzed which are sent through a Pockels element with a predetermined offset phase. A signal reconstruction of the electrical voltage to be measured is done via a special counting method that evaluates the zero crossings of polarization signals derived from the two light signals. In principle, therefore, the measuring range of this electro-optical voltage transducer is no longer limited at the top.

Furthermore, a magneto-optical current transducer which generates two electrical signals which are in each case multi-valued functions of the current to be measured and are phase shifted by an angle of 90° with respect to one another is known from European Patent EP 0 208 593 B1. By comparing the signs and the absolute values, a single-valued measurement signal is assembled from these two multi-valued signals. In principal, therefore, the measuring range of this magneto-optical current transducer is also no longer limited at the top.

German Patent DE 196 01 727 C1 discloses a magneto-optical current transducer having an extended measuring range, which supplies a polarization signal which is similar to the function tan (ρ) of the Faraday angle of rotation ρ. In this case, the polarization signal calculated in the analyzing unit is only analyzed within the range of single-valueness of the tan (ρ) function. Compared with the usual embodiment which only supplies a polarization signal proportional to sin (2ρ) according to the above equation (2), this provides a measuring range which is virtually twice as large.

After passing through the sensor element, electrical signals are generated from the partial light signals via photo-electrical transducer units. In deriving the polarization signal from the electrical signals, the configurations disclosed in German Patent DE 196 01 727 C1 and in International Patent Disclosure WO 95/10046 initially use analog circuit technology. However, there are also indications that the analysis can be carried out digitally in a corresponding manner. A digital analysis of an optical current transducer is also disclosed in the report titled "Vergleichende Darstellung verschiedener magneto-optischer Stromwandlerkonzepte" (Comparative Representation of Various Magneto-Optical Current Transducer Concepts) by T. Bosselmann, $113^{th}$ PTB Seminar "Unkonventionelle Meßwandler für Hochspannungsnetze" (Unconventional Measurement Transducers for High-Voltage Systems), Braunschweig, Nov. 15–16, 1993. In this report, the electrical signals at the output of the photo-electric transducer units are initially digitized via analog/digital (A/D) converters and are then processed further in a digital calculating unit which can contain, for example, a digital signal processor. This digital form of signal processing is very useful especially if it is intended to eliminate disturbances such as, for example, temperature influences, or the characteristic, which is sinusoidal according to equation (2), is to be linearized. At present, optical transducers predominantly use digital analysis for exactly this reason.

The quantization of the electrical signals in A/D converters mandatorily generates an additional noise component, the so-called quantization noise. This additional noise component is disturbing especially if very small signal amplitudes of the alternating electrical quantity are to be measured and, associated with this, also very small changes in polarization are to be detected. This quantization noise thus limits the analyzable dynamic range of the optical transducer.

SUMMARY OF THE INVENTION

It is accordingly an object of the invention to provide a method and a configuration for processing at least one analog signal containing a number of frequency ranges, which overcomes the above-mentioned disadvantages of the prior art devices of this general type, which have a quantization noise which is reduced in comparison with the prior art, and an extended dynamic range. In particular, it is also intended to achieve an improvement in the signal-to-noise ratio.

With the foregoing and other objects in view there is provided, in accordance with the invention, a method for processing a signal having a number of frequency ranges. The method includes deriving at least one analog signal which is a successor signal derived from electrical signals, including a first electrical signal and a second electrical signal, of an optical transducer for an alternating electrical quantity. The successor signal is divided into a DC component and a residual component. An amplified residual component is generated from the residual component by analog amplification by an analog gain factor. Digital electrical signals and an amplified digital residual component are generated from the electrical signals and the amplified residual component. A digital polarization signal, which depends on the alternating electrical quantity to be measured, is generated from the digital electrical signals, the amplified digital residual component, a digital DC component corresponding to the DC component, and a digital gain factor corresponding to the analog gain factor.

The method according to the invention for processing at least one analog signal containing a number of frequency ranges is a method in which:

a) the analog signal is divided into a number of partial analog signals having in each case a different frequency range;

b) from at least one of the partial analog signals, an amplified partial signal corresponding to the one partial analog signal is generated by analog amplification by an analog scaling factor;

c) a partial digital signal is generated from the amplified partial signal by digitization; and d) the analog scaling factor is adapted to the dynamic range during the digitization.

The configuration according to the invention for processing at least one analog signal containing a number of frequency ranges is a configuration formed of:

a) a device for dividing the analog signal into a number of partial analog signals having in each case a different frequency range;

b) at least one analog amplifier having an analog scaling factor for generating an amplified partial signal from one of the partial analog signals;

c) a digitizing device for generating a partial digital signal from the amplified partial signal; and d) the analog scaling factor is adapted to a dynamic range of the digitizing device.

In this context, the invention is based on the finding that the quantization noise of the digitizing device for generating digital signals, especially that of an A/D converter, is additively superimposed on a useful signal. The quantization noise is only dependent on the selected A/D converter but not on the signal to be digitized. The quantization noise thus limits the detectability of small signal amplitudes as background noise. The quantization noise thus also limits the dynamic range overall.

An analog signal is frequently composed of a number of frequency ranges that contain different signal levels. Dividing the analog signal into the partial signals in accordance with these frequency ranges provides the possibility of amplifying each partial signal in accordance with its partial-signal level and thus of adapting it to the dynamic range of the subsequent A/D converter. As a result, the useful-signal components in the partial signals are amplified in each case, whereas the quantization noise, which is only dependent on the A/D converters, remains constant. Thus, the relative noise contribution of the quantization noise falls, resulting in an improved total signal-to-noise ratio.

It is not always necessary to amplify all partial signals. This is not necessary, in particular, if the corresponding partial-signal levels already drive the subsequent A/D converters to a high degree. In practice, additional amplification will not bring any further advantages. On the other hand, it is also possible that at least one of the partial signals is not amplified but attenuated. This can be provided, for example, for a partial signal having a low information content but a very high partial-signal level. The analog scaling factor can thus assume values of greater than, equal to or less than one.

In an advantageous embodiment of the method and of the configuration, all partial signals are in each case amplified for adapting them to the dynamic ranges of the respective subsequent digitizing devices (i.e. A/D converters). In this case, all partial signals in each case have partial-signal levels that do not optimally drive the digitizing devices. In this case, the respective amplification of all partial signals provides the above-mentioned advantages.

In a further advantageous embodiment of the method, the analog signal is digitally reconstructed. For this purpose, a digital signal that corresponds to the analog signal is formed from the partial digital signals present at the output of the digitizing device. For this purpose, digital inverse operations corresponding to the division of the analog signal into the partial signals and the subsequent amplification of the partial signals are performed. Each partial digital signal is thus digitally divided by a digital scaling factor corresponding to the analog scaling factor. A subsequent digital summation then results in the digital signal. The digital signal thus produced has a better signal-to-noise ratio than an analog signal that is directly digitized.

In another advantageous embodiment of the method, the partial digital signals are subjected to additional digital filtering in order to correct the errors in the phase and/or amplitude response which were produced during the analog division. As a result, the accuracy of the digital signal can be further improved.

In an advantageous embodiment, a digital calculating unit is provided in which the method steps described above are advantageously performed.

An embodiment is preferred in which the measures described above are used for processing output quantities of an optical transducer. The optical transducer is configured for detecting an electrical quantity to be measured, for example an electrical voltage or an electrical current. In this embodiment, the analog signal then corresponds to a successor signal that is derived from the output quantities of the optical transducer. In this connection, output quantity of the optical transducer is understood to be an electrical signal of a photo-electrical conversion. The successor signal is formed from at least one of these electrical signals.

A frequency spectrum of the electrical quantity to be measured that is to be detected generally extends from 0 Hz to some 10 kHz. In connection with the public electricity supply, a quantity to be measured which has a relevant DC component occurs in particular in high-voltage direct-current transmission. In other cases, the dominant frequency component is the usual 50 Hz or 60 Hz system frequency. Higher-frequency components in the quantity to be measured originate from harmonics of the system frequency or from transients. These frequency components of the quantity to be measured normally have quite different signal levels. Since these different signal levels are also found in the successor signal, it can be advantageously divided and processed further in accordance with the procedure described.

An advantageous embodiment of the method and of the configuration relates to the processing of output quantities of an optical transducer for an alternating electrical quantity. In this connection, an alternating electrical quantity is understood to mean that the associated spectrum only has frequency components that differ from zero. At least one successor signal formed from two electrical signals is divided into a DC component and a residual component, of which only the residual component is amplified in an analog manner by a gain factor. The two electrical signals and the amplified residual component are digitized and used for digitally determining a polarization signal that depends on the alternating quantity to be measured. Further input quantities used are a digital DC component and a digital gain factor that correspond to their respective analog counterpart.

It is especially in the case of small signal amplitudes of the alternating quantity to be measured that the electrical signals are in each case composed of the larger DC component, corresponding to a (DC) light signal which is sent through a sensor element of the optical transducer, and of a smaller second part which is here called residual component and which carries the information on the alternating electrical quantity to be measured. The residual component thus contains the useful signal of the optical transducer.

Separating the DC component, which does not carry any information in this case, before digitization provides the margin for an upstream analog amplification of the remaining residual component (useful signal). The amplification of the residual component can then be adapted to the present situation, i.e. the dynamic range, of the A/D converter. Since the DC component is much larger than the residual component especially in the case of small signal amplitudes, amplification of the electrical signal in its original form would very rapidly lead to the A/D converter being overdriven.

Taking into consideration the amplified digital residual component with its improved signal-to-noise ratio when calculating the digital polarization signal, a signal-to-noise ratio is obtained which is also improved overall. In comparison with digitization without upstream amplification, the gain of the signal-to-noise ratio is up to 6 dB multiplied by the binary logarithm of the analog gain factor used. This also results in the desired extension of the dynamic range.

Since the original electrical signals are also digitized at the same time as the amplified residual component, and are supplied to the digital calculating unit, the possibilities for acquiring large signal amplitudes, in particular, remain to their full extent in accordance with the prior art.

The embodiments of the method and the configuration quoted in the text that follows all relate to the last-mentioned embodiment of the method and of the configuration for processing the output quantities of the optical transducer for the alternating electrical quantity. A total of three preferred embodiments of the method relate to the dividing of the successor signal formed from the electrical signals.

In a first embodiment, the successor signal is subjected both to low-pass and high-pass filtering. The low-pass filtering supplies the DC component and the high-pass filtering supplies the residual component. The high-pass filtering is advantageously configured to be complementary to the low-pass filtering so that the sum of DC component and residual component provides exactly the successor signal. Thus, no frequency components of the successor signal are lost due to the two filtering operations.

In a second advantageous embodiment of the method, the DC component is also determined by low-pass filtering. The residual component, however, is now not determined via high-pass filtering but by forming the difference between the successor signal and the DC component. This saves the high-pass filtering in comparison with the aforementioned embodiment.

A third advantageous embodiment for dividing the successor signal manages without explicit filtering. Instead, the DC component is reproduced by an offset value to be predetermined. The residual component is determined by forming the difference between the successor signal and the DC component analogously to the second embodiment described above.

This procedure is possible since a light intensity of the light signal radiated into the sensor element is known and can even be set via a light source. In consequence, the value of the DC component, which is decisively determined by the light intensity, in the successor signal is known at least approximately. If the offset value to be predetermined is then set in accordance with this known value, a very good replica of the actual DC component is obtained. The deviation from the actual DC component in this method can stay within tolerable limits which are given by a positive and a negative quotient from the DC component and the analog gain factor [±(DC component/analog gain factor)] without the results being decisively impaired.

The predetermination of the offset value which may slightly deviate from the actual DC component under certain circumstances results in a residual component that still has a small DC component after the difference has been formed with the successor signal. If, however, the deviations are within the tolerable error limits, the amplification of the residual component, which is decisive for improving the signal-to-noise ratio, can still be advantageously carried out before the downstream digitization.

The subject-matter of three further preferred embodiments of the method is the forming of at least one successor signal and the determination of the digital polarization signal which depends thereon.

In a relevant first preferred embodiment, only a single successor signal is derived. This corresponds to a successor signal to one of the two electrical signals. The successor signal is divided into the DC component and the residual component in accordance with the embodiments described above, and the residual component is amplified. This is followed by digitization of the two electrical signals, of the amplified residual component and, depending on the embodiment used, the dividing of also the DC component. The digital polarization signal is then determined from these digital signals and the digital gain factor.

The digital gain factor can be present as a fixed digital value that corresponds to the preset analog gain factor. As an alternative, it is possible to select the digital gain factor in accordance with the instantaneous signal amplitude and to set the analog gain factor in accordance with the selected digital gain factor.

In a second preferred embodiment, two successor signals are used, each of the two electrical signals corresponding to one successor signal and being divided, amplified and digitized as described above. The digital polarization signal is determined with the aid of the digital amplified residual components, the digital DC components, the electrical signals and the digital gain factors.

In a third advantageous embodiment, the successor signal is generated from the two electrical signals by forming a difference signal.

Assuming ideal conditions, a difference between the two electrical signals would only contain a component that is dependent on the quantity to be measured right from the start, that is to say the residual component. In general, however, the difference signal will have a DC component that can be split off by the method steps described above due to the disturbances occurring in reality such as temperature influences or asymmetries.

Amplification is only performed for the residual component carrying the measurement information. The digital polarization signal is determined by the digital electrical signals, the digital amplified residual component of the difference signal, the digital DC component of the difference signal and the digital gain factor.

A total of three preferred embodiments of the configuration relate to the device for dividing the successor signal formed from the electrical signals. What has been mentioned in connection with the corresponding embodiments of the method, especially with respect to the advantages, analogously also applies to the relevant three embodiments of the configuration.

In the first one of the three embodiments, in each case one low-pass filter and one high-pass filter are provided for dividing the successor signal into the DC component and the residual component. The DC component is present at an output of the low-pass filter and the residual component is present at an output of the high-pass filter. It is advantageous if the high-pass filters are configured to be directly complementary to the low-pass filter.

In the second embodiment, a low-pass filter for forming the DC component is also provided. The successor signal is present at a positive input of a summing element and the DC component is present at a negative input of the summing element so that the summing element forms the residual component as the difference between the successor signal and the DC component.

In the third embodiment, an adjustable offset source is provided. In this embodiment, an output signal of the offset source represents the DC component of the successor signal. Analogously to the second embodiment described, a summing element supplies the residual component as the difference between the successor signal and the DC component which, in this case, is formed by the output signal of the offset source.

An advantage of the last-mentioned embodiment consists in saving the A/D converter for determining the digital DC component. Since the output signal of the offset source is known and predetermined, it can be stored directly as digital DC component in the digital calculating unit.

The subject matter of a further advantageous embodiment of the configuration is the formation of the successor signal. A summing element is provided, at a positive input of which one of the two electrical signals and at a negative input of which the other one of the two electrical signals are present. The summing element supplies the successor signal as a difference signal from the two electrical signals. The influence of the DC component of the difference signal, which is determined by disturbances, can thus be minimized due to being split off before the analog amplifier. At the analog amplifier, only the residual component is present which carries the measurement information. The DC component, which contains disturbing quantities, is not amplified.

In a preferred variant of the configuration, the digitizing device for generating digital electrical signals, a digital DC component and a digital amplified residual component are in each case constructed as A/D converters.

In an advantageous modification of this variant, the A/D converter for digitizing the DC component can be omitted. The digital DC component needed for calculating the digital polarization signal in the digital calculating unit can already be present in stored form in the digital calculating unit. To this end, reference is made to the discussion on dividing the successor signal into the DC component and the residual component by an offset source.

On the other hand, however, it is also possible to determine the digital DC component in the digital calculating unit by digital filtering of the digital electrical signals. The digital electrical signals are in any case available to the digital calculating unit. The digital filtering in the digital calculating unit then reproduces exactly the characteristic of the low-pass filter used for the dividing into DC component and residual component.

The digital calculating unit advantageously contains a digital signal processor (DSP), a microcontroller, a microprocessor or an application specific integrated circuit (ASIC) as the arithmetic unit. The arithmetic units are particularly suitable for the calculations to be performed in real time such as the digital filtering, the compensation of temperature influences or the linearization of characteristics, due to their high processing speed and high arithmetic accuracy.

In another preferred embodiment of the configuration, the optical transducer for the alternating electrical quantity is equipped with a two-channel analysis which contains a series circuit of the sensor element, a beam-dividing analyzer, preferably in the form of a Wollaston prism or a polarizing beam divider, and the two photo-electric transducer units. In the analyzer, a light signal that has first passed through the sensor element is divided into two partial light signals having mutually perpendicular planes of polarization. The photo-electric transducer units convert the two partial light signals into the two electrical signals. The photo-electric transducer units are preferably built up in each case of a photodiode and a downstream transimpedance amplifier. The electrical signals are preferably proportional to the light intensities of the two partial light signals.

A preferred variant of the embodiment with two-channel analysis as described provides the sensor element as a magnetic-field-sensitive Faraday element or as a Pockels element that is sensitive to an electric field.

The magnetic-field-sensitive Faraday element can be present in the form of a glass ring or a fiber coil through which an electrical conductor passes through and which conducts a current flows. An alternating current flowing in the electric conductor then represents the alternating quantity to be detected. The Faraday element is sensitive to a magnetic field generated by current.

The Pockels element can be present in the form of an electro-optical monocrystal that alters the polarization of the light signal when it passes through. The change is dependent on an electric field in which the electro-optical monocrystal is located. However, the electric field in the electro-optical monocrystal can also be generated via an alternating electrical voltage that is present at electrical feed lines at the electro-optical monocrystal. This alternating electrical voltage then represents the alternating quantity to be detected.

In a further preferred embodiment of the configuration, the optical transducer for the alternating electrical quantity is equipped with injection of a first and a second light signal in opposite directions. For this purpose, devices are provided which inject the two light signals with in each case an opposite direction of travel into a Faraday element which is sensitive to magnetic fields and, after they have passed through the Faraday element, to supply them in each case to one of the two photo-electric transducer units. These devices are preferably constructed as couplers, especially as fiber couplers.

In accordance with an added feature of the invention, the successor signal is only one successor signal corresponding to one of the electrical signals and the digital polarization signal is determined in accordance with:

$$P' = 1 - 2 * \frac{\frac{I2rv'}{A2'} + I2d'}{I1' + I2'}$$

where
P' is the digital polarization signal,
I2rv' is the amplified digital residual component,
A2' is the digital gain factor,
I2d' is the digital DC component, and
I1', I2' are the digital electrical signals.

In accordance with an additional feature of the invention, there is the step of providing two successor signals corresponding in each case to one of the two electrical signals, and the digital polarization signal is determined in accordance with:

$$P' = \frac{\left(\frac{I1rv'}{A1'} + I1d'\right) - \left(\frac{I2rv'}{A2'} + I2d'\right)}{I1' + I2'}$$

where
P' is the digital polarization signal,
I1rv', I2rv' are the amplified digital residual components,
A1', A2' are the digital gain factors,
I1d', I2d' is the digital DC component, and
I1', I2' are the digital electrical signals.

In accordance with another feature of the invention, there is the step of deriving a difference signal being the difference between the first electrical signal and the second electrical signal and is formed as the successor signal. The digital polarization signal is determined in accordance with:

$$P' = \frac{\frac{I12rv'}{A12'} + I12d'}{I1' + I2'}$$

where
P' is the digital polarization signal,
I12rv' is the amplified digital residual component of the difference signal,
A12' is the digital gain factor of the difference signal,
I12d' is the digital DC component of the difference signal, and
I1', I2' are the digital electrical signals.

In accordance with a further feature of the invention, there is the step of generating the digital DC component from the DC component.

In accordance with another added feature of the invention, there is the step of generating the digital DC component from the DC component using analog/digital conversion.

In accordance with another additional feature of the invention, there is the step of determining the digital DC component from the digital electrical signals by one of digital filtering and a stored fixed digital value.

In accordance with a further added feature of the invention, there is the step of generating the first electrical signal and the second electrical signal in each case from first and second partial light signals. The first and second partial light signals are formed from a photo-electric conversion of a light signal, the light signal passes through a sensor element and is then divided into the first and second partial light signals which are polarized perpendicularly to one another.

In accordance with a further additional feature of the invention, there is the step of selecting the sensor element from the group consisting of Faraday elements sensitive to magnetic fields and Pockels elements sensitive to an electric field.

In accordance with yet another feature of the invention, there is the step of generating the first electrical signal and the second electrical signal in each case from first and second light signals by photo-electric conversion. The first and second light signals are sent in opposite directions through a sensor unit having a Faraday element which is sensitive to magnetic fields.

With the foregoing and other objects in view there is further provided, in accordance with the invention, a configuration for processing a signal having a number of frequency ranges. The configuration includes a divider circuit receiving and dividing at least one successor signal into a DC component and a residual component. The successor signal is derived from two electrical signals of an optical transducer for an alternating electrical quantity and the successor signal corresponds to an analog signal. An analog amplifier is disposed downstream of the divider circuit and receives the residual component. The analog amplifier has an analog gain factor and generates an amplified residual component from the residual component. Digitizing devices receiving the amplified residual component and the two electrical signals are provided. The digitizing devices generate digital electrical signals and a digital amplified residual component from the two electrical signals and the amplified residual component, respectively. A digital calculating unit for determining a digital polarization signal is connected to the digitizing devices. The digital polarization signal is dependent on the alternating electrical quantity to be measured. The digital polarization signal is derived from the digital electrical signals, the digital amplified residual component, a digital DC component corresponding to the DC component, and a digital gain factor corresponding to the analog gain factor.

In accordance with an added feature of the invention, a summing element is provided for forming the successor signal being a difference between the two electrical signals. The summing element is connected to the divider circuit and to the digitizing devices.

In accordance with an additional feature of the invention, a further digitizing device is connected to the divider circuit and receives the DC component. The further digitizing device generates the digital DC component from the DC component.

In accordance with another feature of the invention, a sensor element outputting a light signal is provided. An analyzer is connected to the sensor element and divides the light signal into two partial light signals with mutually perpendicular polarization. Two photo-electric transducer units are disposed downstream of the sensor element and the analyzer. Each of the two photo-electric transducer units generate one of the two electrical signals from one of the two partial light signals.

In accordance with a further feature of the invention, the sensor element is selected from the group consisting of Faraday elements sensitive to magnetic fields and Pockels elements sensitive to an electric field.

In accordance with a concomitant feature of the invention, a sensor element containing a Faraday element sensitive to magnetic fields is provided. A first photo-electric transducer unit and a second photo-electric transducer unit are further provided. A plurality of devices are also provided. One of the devices is disposed between the sensor element and the first photo-electric transducer unit and another of the devices is disposed between the sensor element and the second photo-electric transducer unit. The devices inject oppositely directed first and second light signals into the sensor element and into the first and second photo-electric transducer unit for generating in each case one of the two electrical signals from in each case one of the first and second light signals.

Other features which are considered as characteristic for the invention are set forth in the appended claims.

Although the invention is illustrated and described herein as embodied in a method and a configuration for processing at least one analog signal containing a number of frequency ranges, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
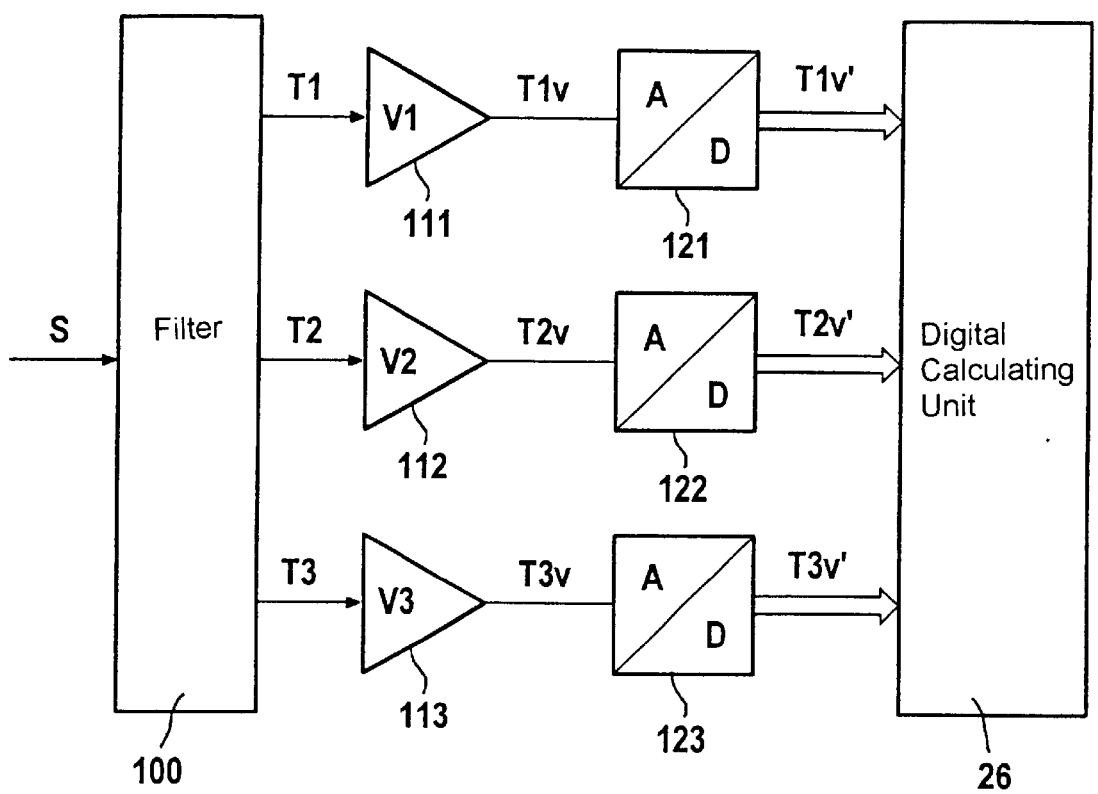
FIG. 1 is a block diagram of a configuration for processing an analog signal according to the invention.

In all the figures of the drawing, sub-features and integral parts that correspond to one another bear the same reference symbol in each case. Referring now to the figures of the drawing in detail and first, particularly, to FIG. 1 thereof, there is shown a configuration for processing an analog signal S. In the present case, the analog signal S represents an output quantity of an optical transducer for an electrical quantity to be measured. The output quantity of such an optical transducer, which is used in the field of public energy supply, covers a frequency range from 0 Hz to some 10 kHz. In this context, individual frequency components are present with signal levels that in each case deviate from one another greatly. Interesting components are especially a DC component, a frequency component at the 50 Hz/60 Hz system frequency and harmonics of this system frequency. In addition, transient events have a frequency component that is of interest up to some 10 kHz.

To obtain the best possible total signal-to-noise ratio, an analog frequency filter 100 divides the analog signal S into three partial signals T1, T2 and T3 in accordance with the frequency ranges which are mainly of interest. The first partial signal T1 corresponds to a DC component, the second partial signal T2 corresponds to a system frequency component and the third partial signal T3 corresponds to a frequency component which contains higher frequencies than the system frequency.

The three partial signals T1, T2 and T3 are amplified with in each case associated analog scaling factors V1, V2 and V3 in analog amplifiers 111, 112 and 113. The analog scaling factors V1, V2 and V3 are in each case dimensioned in such a manner that at an output of the amplifiers 111, 112 and 113, in each case amplified partial signals T1v, T2v and T3v are present which optimally drive downstream analog/digital (A/D) converters 121, 122 and 123. The analog amplification in each case matches the levels of the partial signals T1, T2 and T3 to the dynamic ranges of the A/D converters 121, 122 and 123.

The A/D converters 121, 122 and 123 generate partial digital signals T1v', T2v' and T3v' with an improved signal-to-noise ratio since due to the upstream level adaptation in the amplifiers 111, 112 and 113, useful signal components in the partial signals T1, T2 and T3 are lifted and, at the same time, any quantization noise of the A/D converters 121, 122 and 123 remains constant.

The partial digital signals T1v', T2v' and T3v' are fed into a digital calculating unit 26 in which further digital processing measures follow. For example, a digital replica of the analog signal S can be generated in that the partial digital signals T1v', T2v' and T3v' are subjected to a digital division which corresponds to an inverse operation of the analog amplification. After summation of the signals then present, the digital replica of the analog signal S is obtained. If necessary, digital filtering can also be interposed in order to correct any phase and/or amplitude errors which have arisen during the frequency division of the analog signal S into the partial signals T1, T2 and T3. In addition, the partial digital signals T1v', T2v' and T3v' are used in the digital calculating unit 26 for determining a measurement signal for the electrical quantity to be measured by the optical transducer.

Figure 2:
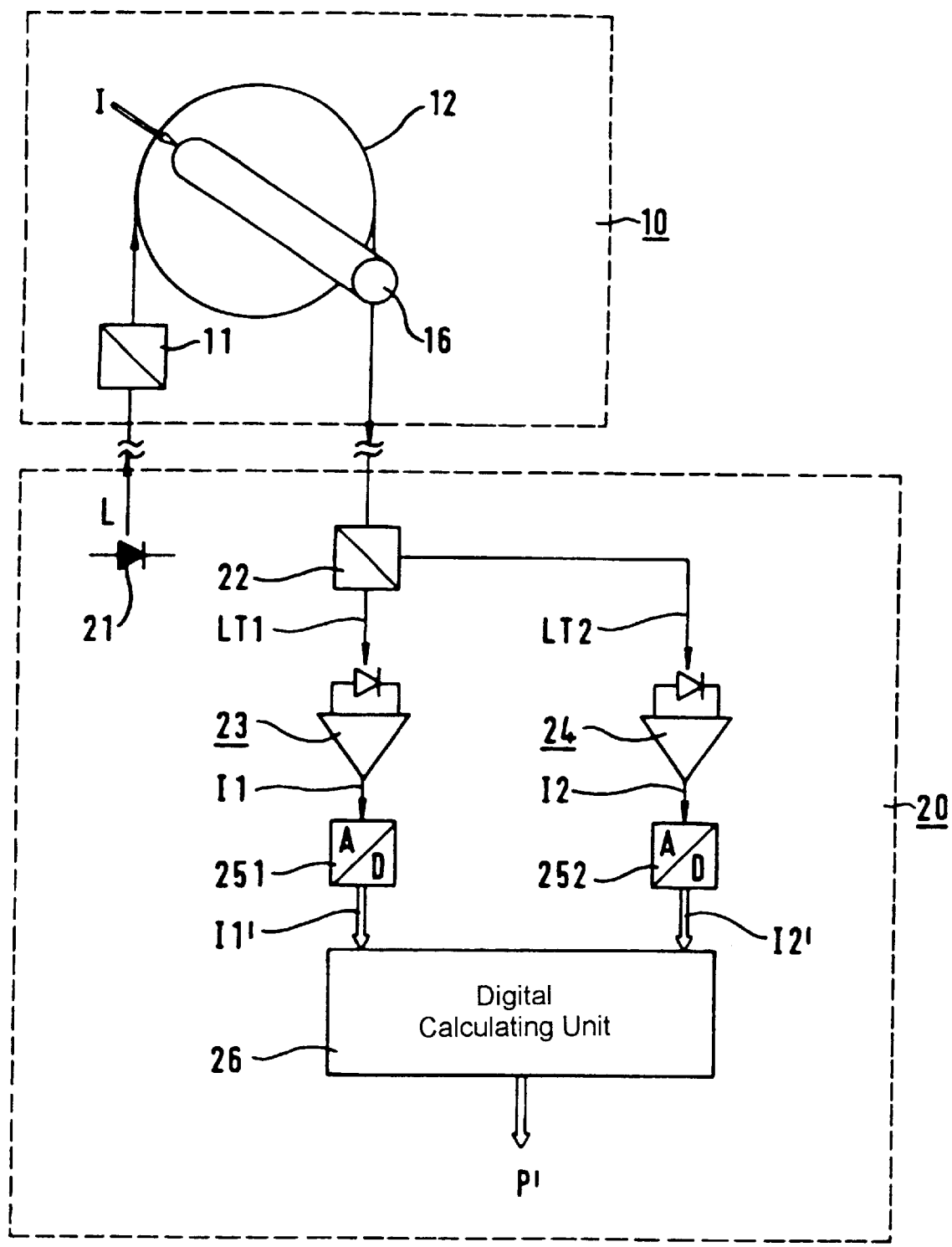
FIG. 2 is a block diagram of an optical current transducer with a processing circuit according to the prior art.

To illustrate the differences, FIG. 2 shows an optical current transducer that processes analog signals according to the prior art.

The current transducer is subdivided into a sensor unit 10 and a transceiver unit 20. The sensor unit 10 contains a sensor element, in the present case a Faraday element 12, which encloses an electrical conductor 16 through which an electrical current I flows, and is located at a local distance from the transceiver unit 20. In the case of applications in the field of electricity supply, the sensor unit 10 is additionally at a high-voltage potential whereas the transceiver unit 20 is located at ground potential.

A light signal L is generated in a light source 21 of the transceiver unit 20 and sent to the sensor unit 10. Before it passes through the Faraday element 12, the light signal L is linearly polarized in a polarizer 11. The polarizer 11 can be at ground potential or at a high-voltage potential. In the configuration shown, the polarizer 11 is associated with the sensor unit 10. The light signal L passes through the Faraday element 12 where its polarization is changed in dependence on the current I to be measured, and then passes back to the transceiver unit 20.

In a polarizer 22 in the transceiver unit 20, it is split into two partial light signals LT1 and LT2 (two-channel analysis) which have mutually perpendicular planes of polarization. The two partial light signals LT1 and LT2 are converted into electrical signals I1 and I2 in photo-electric transducer units 23 and 24. The electrical signals I1 and I2 are proportional to intensities of the partial light signals LT1 and LT2. They correspond to the analog signal S of FIG. 1. The photo-electric transducer units 23 and 24 in each case contains a photodiode and a downstream transimpedance amplifier.

For the purpose of processing, the electrical signals I1 and I2 are first digitized in each case in an A/D converter 251 and 252, respectively. The digital electrical signals I1' and I2' then present are input quantities for the digital calculating unit 26 in which a digital polarization signal P' is determined. The digital polarization signal P' is a measure of a change of polarization, caused by the current I to be measured, in the light signal L and consequently also a measure of the current I itself. In the prior art, the polarization signal P' is determined from the digital electrical signals I1' and I2' in accordance with the formula according to equation (1):

$$P' = \frac{(I1' - I2')}{(I1' + I2')} \qquad (4)$$

This leads to problems in the detectability of, in particular, small signal amplitudes of the electrical current I due to, among other things, quantization noise of the A/D converters 251 and 252.

Figure 3:
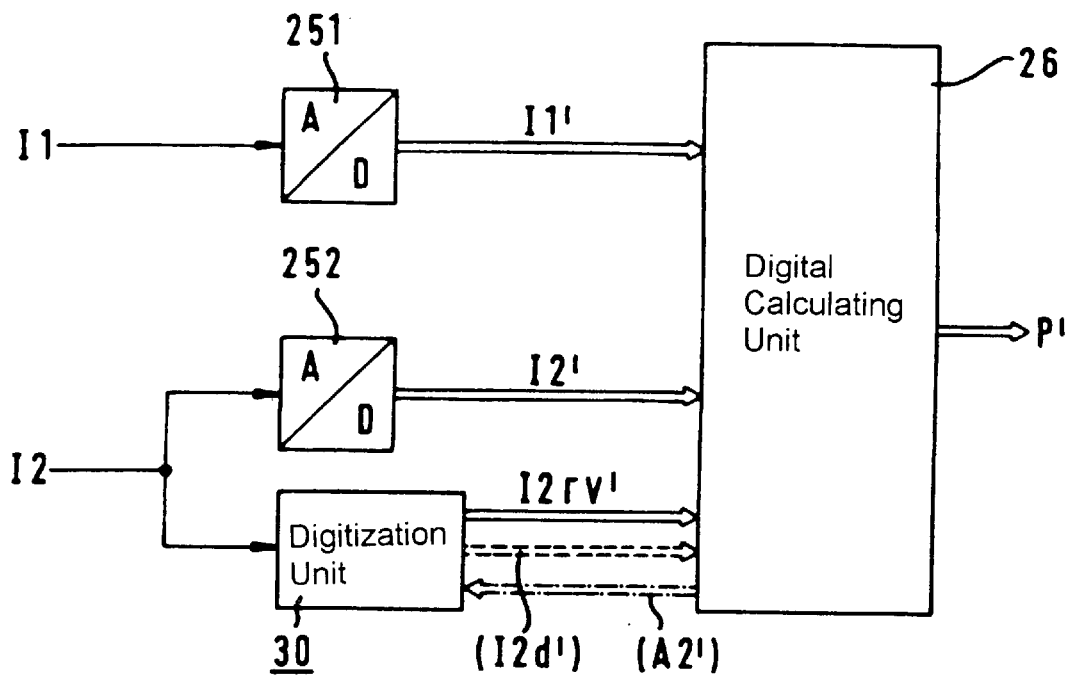
FIG. 3 is a block diagram of configurations for processing two output quantities of the optical transducer according to the invention.

FIG. 3 shows a configuration for processing two output quantities of an optical transducer in which the digital polarization signal P' determined has an improved signal-to-noise ratio in comparison with the prior art according to FIG. 2. In particular, the influence of the noise contribution manditorily produced in the A/D converters 251 and 252 due to the quantization of the electrical signals I1 and I2, is reduced to the resultant signal-to-noise ratio.

For this purpose, the digital calculating unit 26 is supplemented with an additional digitizing unit 30 in which at least one further digital signal for calculating the digital polarization signal P' is provided, in addition to the digital electrical signals I1' and I2'. To carry out the calculation, the digital calculating unit 26 contains a digital signal processor in the present case.

With respect to the noise, the difference of the digital electrical signals I1' and I2' in the numerator of the quotient of equation (4) is found to be the critical quantity. Equation (4) can be equivalently transformed into:

$$P' = 1 - 2 \cdot \frac{I2'}{(I1' + I2')} \qquad (5)$$

The denominator in the quotient of equation (5) contains a sum of the digital electrical signals I1' and I2' which can be considered to be uncritical with respect to the noise. It can thus be formed exactly as in the prior art.

To improve the resultant total signal-to-noise ratio, only optimization of the digital electrical signal I2' in the numerator of the quotient of equation (5) remains.

In the case of small signal amplitudes of the alternating electrical quantity to be measured, the electrical signals I1 and I2 are in each case composed of a dominant DC component I1d and I2d and a very much smaller residual component I1r and I2r.

In the text that follows, the relationships will now be explained with reference to the electrical signal I2. However, they analogously also apply to the electrical signal I1.

Only the residual component I2r and not the DC component I2d that carries the information on the alternating electrical quantity to be measured. Amplification of the electrical signal I2 as a whole for the purpose of adaptation to the dynamic range of the A/D converter 252 would always be limited by the dominant DC component I2d. In the case of separate analog amplification of only the residual component I2r, in contrast, a very much higher analog gain factor A2 can be provided without any downstream A/D converter being overdriven. At the same time, the quantization noise of the downstream A/D converter remains constant seen in absolute terms. Relative to the amplified useful signal (=amplified residual component I2rv), however, the contribution of the quantization noise has become reduced with a digital amplified residual component I2rv' present after the digitization.

In the digital calculating unit 26, the digital electrical signal I2' is synthetically assembled, inter alia from the digital amplified residual component I2rv', in accordance with:

$$I2' = \frac{I2rv'}{A2'} + I2d', \qquad (6)$$

where I2d' is the digital DC component and A2' is a digital gain factor, both of which are present as fixed digital values stored in the digital calculating unit 26.

In an alternative embodiment, the digital residual component I2d' can also be provided by the digitizing unit 30. This case is shown by dashed lines and the bracketing in FIG. 3.

The digital gain factor A2' corresponds to the digital value of the analog gain factor A2 used in the amplification of the residual component I2r.

In a further alternative embodiment, the digital gain factor A2' is not present as a permanently stored digital value but, instead, it is newly determined in the digital calculating unit 26 depending on the current excursion of the A/D converter associated with the digital amplified residual component I2rv'. The current digital gain factor A2' is then provided to the digitizing unit 30 for appropriate adaptation of the analog gain factor A2. This adaptation is carried out with the aid of a digitally programmable analog amplifier.

This embodiment is shown by dot-dash lines and the bracketing in FIG. 3.

With the aid of the digital electrical signal I2' synthesized in accordance with equation (6), and equation (5), the digital polarization signal P' is determined in accordance with:

$$P' = 1 - 2 \cdot \frac{\frac{I2rv'}{A2'} + I2d'}{(I1' + I2')} \qquad (7)$$

in the digital calculating unit 26 and applied to an output. In comparison with the digital polarization signal P' determined in accordance with equation (4) according to the prior art, the digital polarization signal P' determined in accordance with equation (7) exhibits a gain of up to 6 dB multiplied by the binary logarithm of the analog gain factor A2 in the signal-to-noise ratio.

Figure 4:
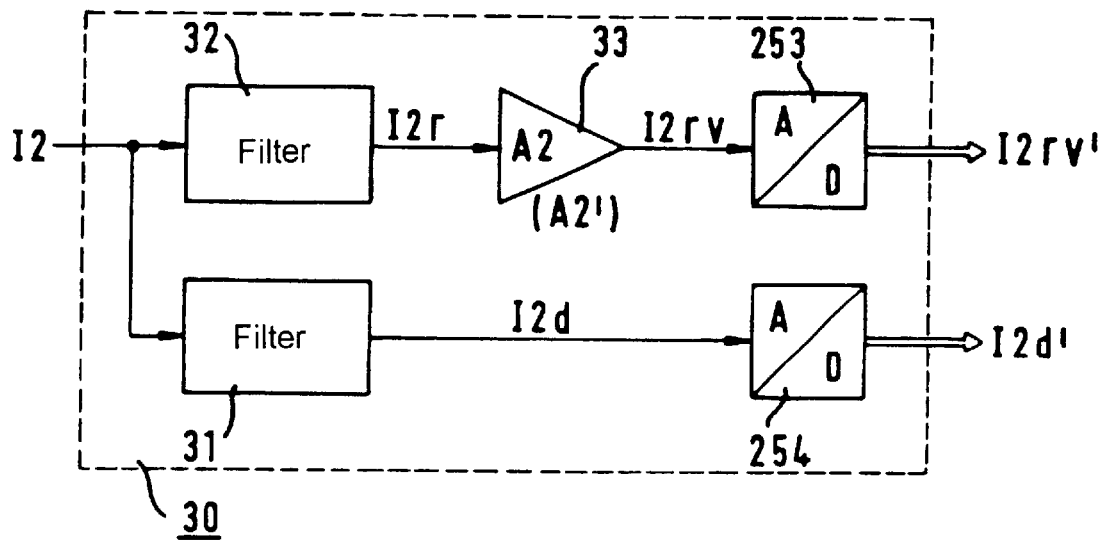
FIGS. 4 to 6 are block diagrams of digitizing units containing devices for dividing a successor signal, for amplifying a residual component and for digitization.
Figure 5:
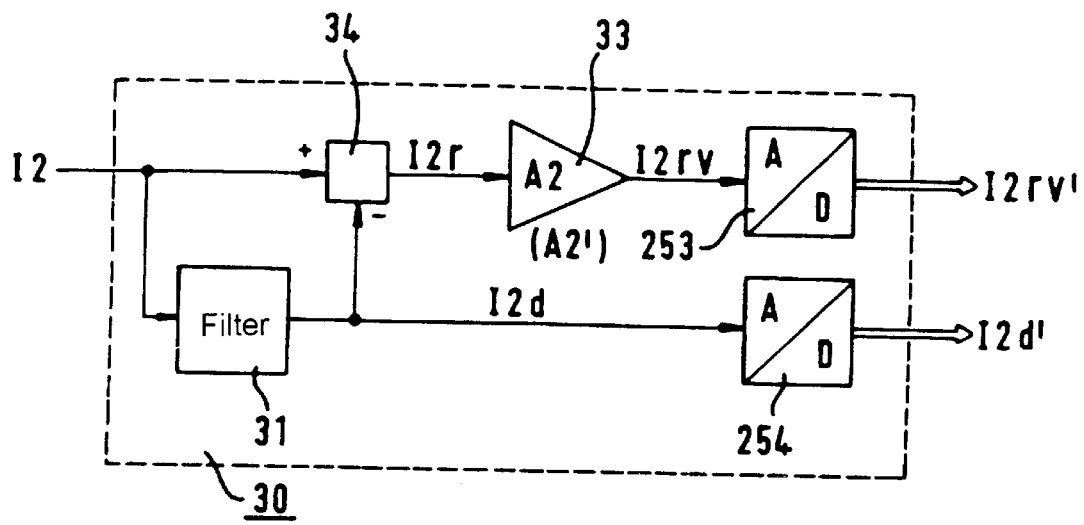
Figure 6:
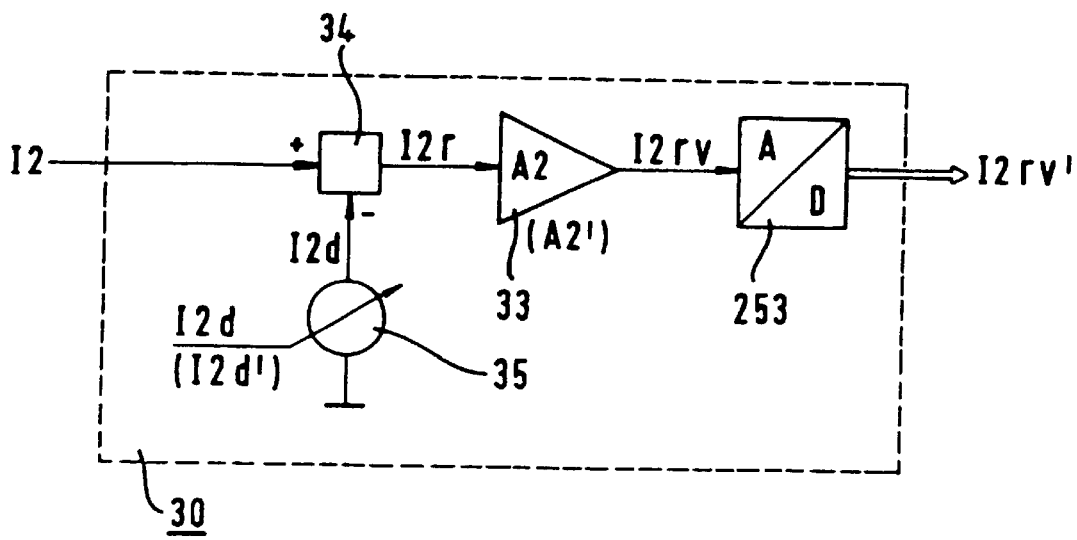

In the text which follows, FIGS. 4 to 6 show examples of implementations of the digitizing unit 30.

The input quantity of the digitizing unit 30 in FIGS. 4 to 6 is a successor signal that is derived from the electrical signals I1 and I2. In the simplest case, the successor signal is identical to one of the two electrical signals I1 and I2. Without restricting the general validity, FIGS. 4 to 6 are in each case based on the case in which the successor signal corresponds directly to the electrical signal I2.

In the first illustrative implementation of the digitizing unit 30 shown in FIG. 4, the electrical signal I2 is supplied to a low-pass filter 31 and a high-pass filter 32. The low-pass filter 31 and the high-pass filter 32 provide division of the electrical signal I2 into a DC component I2d which is present at an output of the low-pass filter 31, and into a residual component I2r which is present at an output of the high-pass filter 32. The DC component I2d is converted directly into a corresponding digital DC component I2d' in an A/D converter 254. The residual component I2r is first amplified by the analog gain factor A2 by an analog amplifier 33 before digitization. An amplified residual component I2rv present at an output of the analog amplifier 33 is supplied to an A/D converter 253 for generating the digital amplified residual component I2rv'.

In the digitizing unit 30 shown in FIG. 5, the high-pass filter 32 in the configuration of FIG. 4 is then replaced by a summing element 34. In this configuration, the electrical signal I2 is present at a positive input of the summing element 34 and the DC component I2d generated by the low-pass filter 31 is present at a negative input of the summing element 34. In this manner, the summing element 34 supplies the residual component I2r as the difference between the electrical signal I2 and the DC component I2d.

In the digitizing unit 30 shown in FIG. 6, the low-pass filter 31 of FIGS. 4 and 5 has been replaced by an offset source 35. The value of the DC component I2d of the electrical signal I2 is essentially known. This results from the knowledge of the light intensity of the light signal L which is radiated into the sensor unit 10, from a dividing ratio of the analyzer 22 and from a conversion constant of the photo-electric transducer unit 24. If the offset source 35 is set exactly to this known value of the DC component I2d, the residual component I2r can be determined, in accordance with the method described in FIG. 5, as the difference between the electrical signal I2 and the DC component I2d with the aid of the reproduced DC component I2d supplied by the offset source 35.

In FIGS. 4 to 6, reference symbols for the digital gain factor A2' and for the digital DC component I2d' (FIG. 6 only) are bracketed. This form of representation is intended to indicate that the quantities are provided to the digital calculating unit 26 as fixed parameters and are stored there. As an alternative, however, the digital gain factor A2' can also be provided as a variable value, determined by the digital calculating unit 26, for adapting the analog gain factor A2 in accordance with the above discussions. The analog amplifier 33 is then constructed as a digitally programmable analog amplifier.

Figure 7:
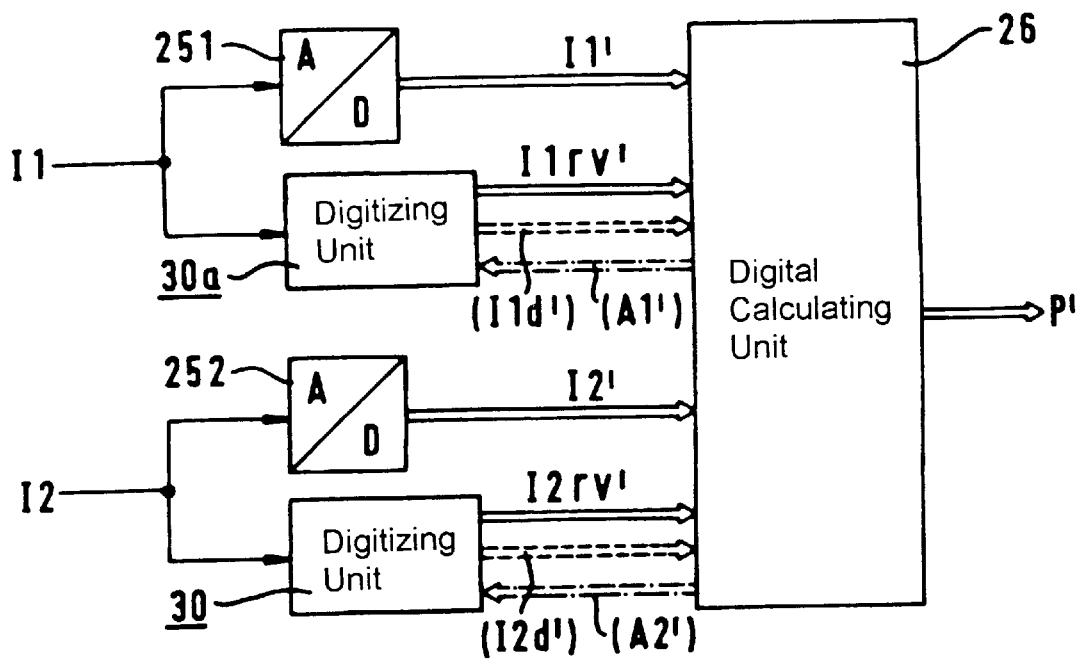
FIGS. 7 and 8 are block diagrams of further configurations for processing two output quantities of the optical transducer.
Figure 8:
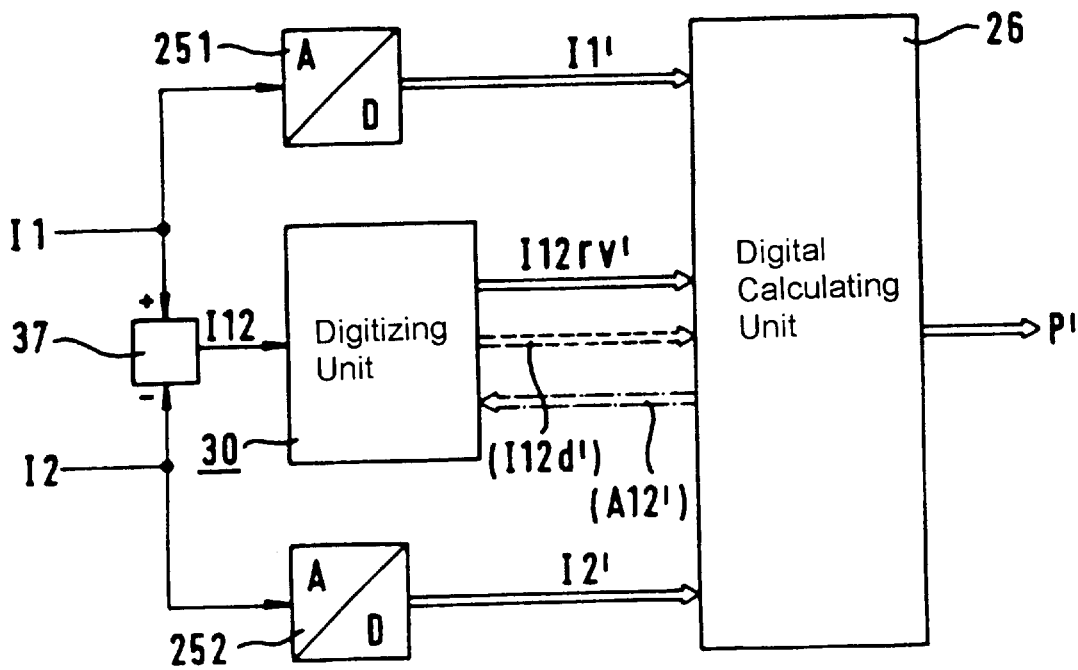

FIGS. 7 and 8 show further illustrative implementations of configurations for processing two output quantities of an optical transducer which have an improved signal-to-noise ratio compared with the prior art according to FIG. 2.

In the illustrative implementation of FIG. 7, in distinction from FIG. 3 a digital amplified residual component I1rv' is also generated, and provided to the digital calculating unit 26, for the electrical signal I1 in an additional digitizing unit 30a. The digital calculating unit 26 generates a synthetic equivalent also for the digital electrical signal I1' in accordance with equation (6) and thus performs the calculation of the digital polarization signal P' in accordance with:

$$P' = \frac{\left(\frac{I1rv'}{A1'} + I1d'\right) - \left(\frac{I2rv'}{A2'} + I2d'\right)}{(I1' + I2')} \qquad (8)$$

where I1d' is the digital DC component and A1' the digital gain factor, both of which are present in stored form in the digital calculating unit 26 as fixed digital values exactly like the digital DC component I2d' and the digital gain factor A2'.

In the illustrative implementation of FIG. 8, a difference signal I12 is first formed from the electrical signals I1 and I2 by a summing element 37. The difference signal I12 thus corresponds to the numerator of the quotient in equation (1). From the difference signal I12, the digitizing unit 30 determines a digital amplified residual component I12rv', which is provided as input quantity to the digital calculating unit 26 like the digital electrical signals I1' and I2'. The digital calculating unit 26 thus determines the digital polarization signal P' in accordance with the following rule:

$$P' = \frac{\frac{I12rv'}{A12'} + I12d'}{(I1' + I2')}, \quad (9)$$

where I12d' is the digital DC component and A12' is the digital gain factor, both of which are present as fixed digital values in stored form in the digital calculating unit 26.

The statements with respect to the dashed and dot-dashed lines, the bracketing of A2' and I2d' and the origin of the digital gain factor A2', made in connection with FIG. 3, can be analogously transferred to the illustrative embodiments of FIGS. 7 and 8. This also applies especially to the digital DC components I1d' and I12d' and to the digital gain factors A1' and A12'.

Since the digital calculating unit 26 is in each case also provided with the digital electrical signals I1' and I2' in all illustrative implementations of FIGS. 3, 7 and 8, the digital polarization signal P' can also be determined in accordance with equation (4).

If large signal amplitudes of the alternating electrical quantity to be measured are present so that the DC components I1d and I2d of the electrical signals I1 and I2 are no longer large compared with the information-carrying residual components I2r and I1r, the digital calculating unit 26 really calculates the polarization signal P' in accordance with equation (4). This is because the advantageous effect of an amplification of the residual components I1r and I2r is no longer given in this case. Thus, the digital calculating unit 26 performs a detection of the current signal amplitudes of the alternating electrical quantity to be measured and then determines the digital polarization signal P' in accordance with these current signal amplitudes. In the case of large signal amplitudes, this is done in accordance with equation (4) and in the case of small signal amplitudes it is done in accordance with one of equations (7) to (9).

Figure 9:
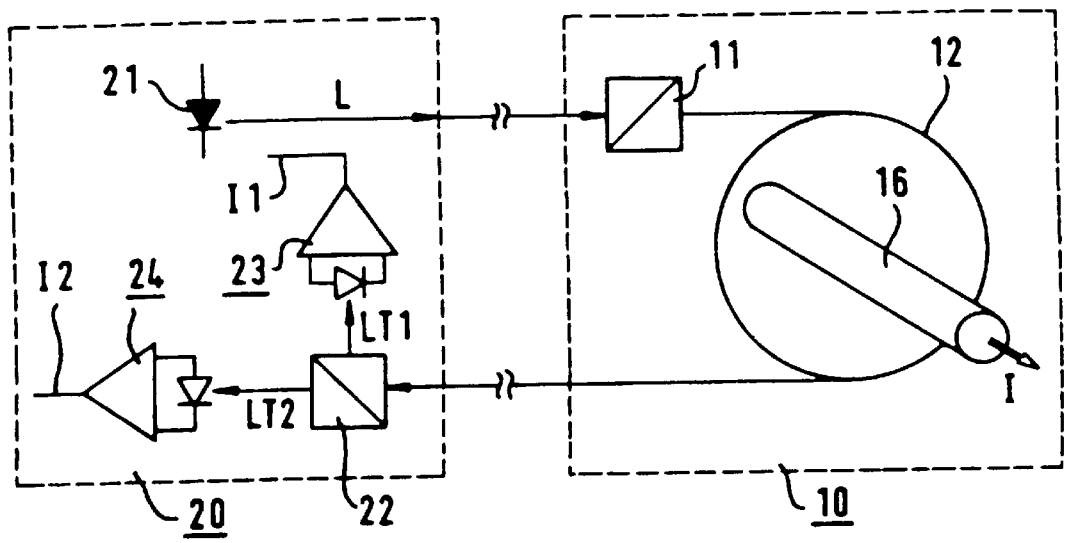
FIG. 9 is a block diagram of an optical current transducer with two-channel analysis.
Figure 10:
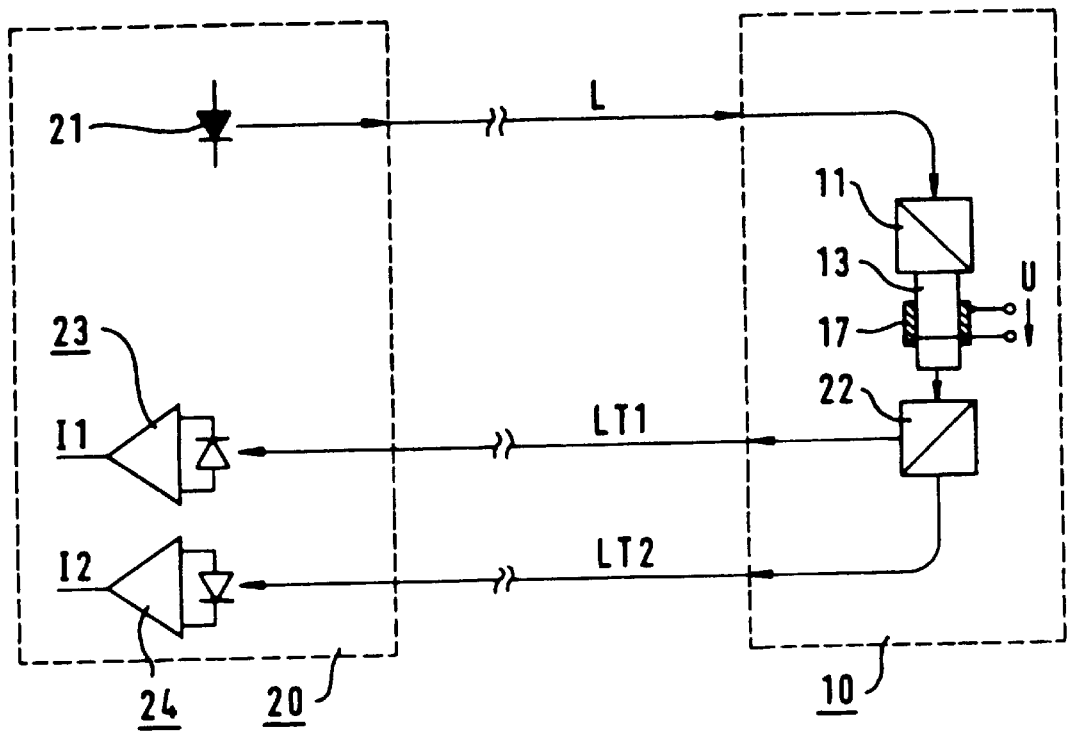
FIG. 10 is a block diagram of an optical voltage transducer with two-channel analysis.
Figure 11:
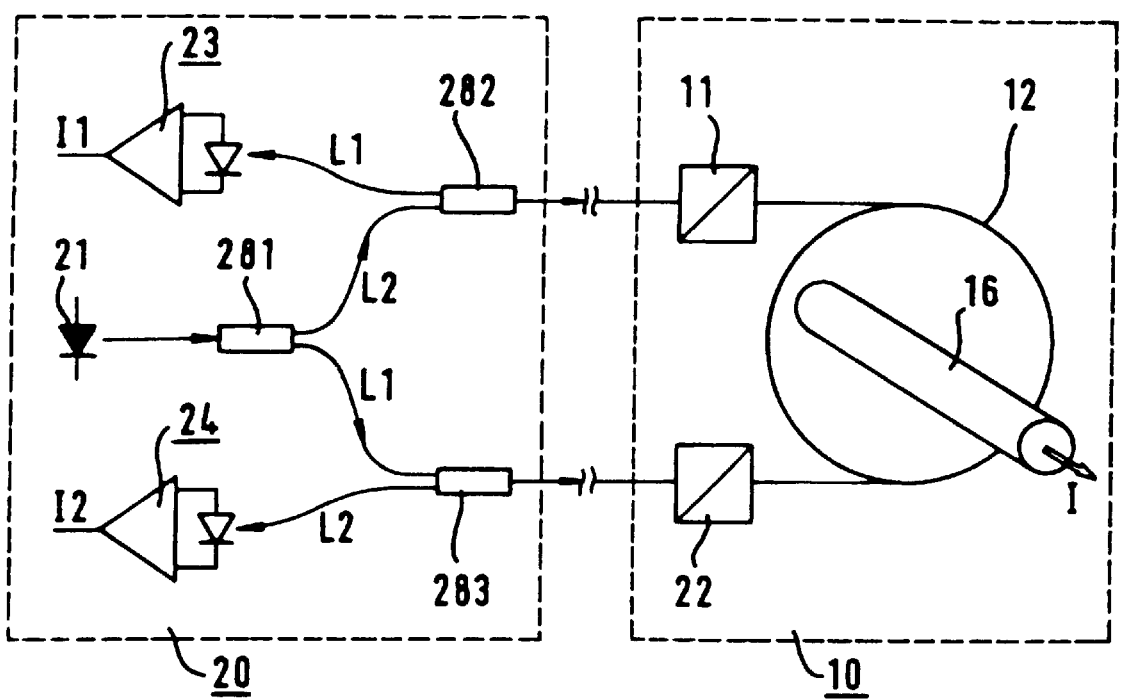
FIG. 11 is a block diagram of the optical current transducer with oppositely-directed light injection.

FIGS. 9 to 11 show optical transducers for alternating electrical quantities with two output signals in the form of the electrical signals I1 and I2. These optical transducers can thus be operated with the configurations for processing shown in FIGS. 3 to 8.

The optical transducer of FIG. 9 is an embodiment that has already been described in connection with the prior art according to FIG. 2.

FIG. 10 represents an optical transducer for acquiring an electrical voltage U. In distinction from the current transducer of FIG. 9 or FIG. 2, respectively, the sensor unit 10 in this case contains, instead of the Faraday element 12, a Pockels element 13 to which the electrical voltage to be measured is applied by electric leads 17. Analogously to the electrical current I in the configurations of FIGS. 2 and 9, the electrical voltage U generates a change in the polarization of the light signal L in the optical voltage transducer of FIG. 10. The procedure in the analysis thus corresponds to the one already described for the optical current transducer.

FIG. 11 shows an optical current transducer with oppositely directed light injection. Couplers, especially fiber couplers 281, 282 and 283 are provided which ensure that two light signals L1 and L2 are injected into the sensor unit 10 with opposite directions of travel and, after passing through the sensor unit 10, are in each case supplied to one of the two photo-electric transducer units 23 and 24.

In these units, the light signals L1 and L2 are converted into the corresponding electrical signals I1 and I2. In this embodiment the analyzer 22 does not perform a dividing into two partial light signals with mutually perpendicular planes of polarization. The electrical signals I1 and I2 are in this case distinguished by the different directions of travel of the basic light signals L1 and L2.

We claim:

1. A method for processing a signal having a number of frequency ranges, which comprises the steps of:

deriving at least one analog signal being at least one successor signal from electrical signals, including a first electrical signal and a second electrical signal, of an optical transducer for an alternating electrical quantity;

dividing the successor signal into a DC component and a residual component;

generating an amplified residual component from the residual component by analog amplification by an analog gain factor;

generating digital electrical signals and an amplified digital residual component from the electrical signals and the amplified residual component; and determining a digital polarization signal, which depends on the alternating electrical quantity to be measured, from the digital electrical signals, from the amplified digital residual component, from a digital DC component corresponding to the DC component, and from a digital gain factor corresponding to the analog gain factor.

2. The method according to claim 1, which comprises determining the DC component by low-pass filtering of the successor signal and the residual component is determined by complimentary high-pass filtering of the successor signal.

3. The method according to claim 1, which comprise determining the DC component by low-pass filtering of the successor signal, and the residual component is determined via a difference between the successor signal and the DC component.

4. The method according to claim 1, which comprises providing an offset value to be predetermined as the DC component, and the residual component is determined by a difference between the successor signal and the DC component.

5. The method according to claim 1, wherein the successor signal is only one successor signal corresponding to one of the electrical signals and the digital polarization signal is determined in accordance with:

$$P' = 1 - 2 * \frac{\frac{I2rv'}{A2'} + I2d'}{I1' + I2'}$$

where

P' is the digital polarization signal,

I2rv' is the amplified digital residual component,

A2' is the digital gain factor,

I2d' is the digital DC component, and

I1', I2' are the digital electrical signals.

6. The method according to claim 1, which comprises providing two successor signals corresponding in each case to one of the two electrical signals, and the digital polarization signal is determined in accordance with:

$$P' = \frac{\left(\frac{I1rv'}{A1'} + I1d'\right) - \left(\frac{I2rv'}{A2'} + I2d'\right)}{I1' + I2'}$$

where

P' is the digital polarization signal, $I1rv'$, $I2rv'$ are the amplified digital residual components, A1', A2' are the digital gain factors, $I1d'$, $I2d'$ is the digital DC component, and I1', I2' are the digital electrical signals.

7. The method according to claim 1, which comprises deriving a difference signal being a difference between the first electrical signal and the second electrical signal is formed as the successor signal and the digital polarization signal is determined in accordance with:

$$P' = \frac{\frac{I12rv'}{A12'} + I12d'}{I1' + I2'}$$

where

P' is the digital polarization signal, $I12rv'$ is the amplified digital residual component of the difference signal, A12' is the digital gain factor of the difference signal, $I12d'$ is the digital DC component of the difference signal, and I1', I2' are the digital electrical signals.

8. The method according to claim 1, which comprises generating the digital DC component from the DC component.

9. The method according to claim 8, which comprises generating the digital DC component from the DC component using analog/digital conversion.

10. The method according to claim 8, which comprises determining the digital DC component from the digital electrical signals by one of digital filtering and a stored fixed digital value.

11. The method according to claim 1, which comprises generating the first electrical signal and the second electrical signal in each case from first and second partial light signals, the first and second partial light signals are formed from a photo-electric conversion of a light signal, the light signal passes through a sensor element and is then divided into the first and second partial light signals which are polarized perpendicularly to one another.

12. The method according to claim 11, which comprises selecting the sensor element from the group consisting of Faraday elements sensitive to magnetic fields and Pockels elements sensitive to an electric field.

13. The method according to claim 1, which comprises generating the first electrical signal and the second electrical signal in each case from first and second light signals by photo-electric conversion, the first and second light signals are sent in opposite directions through a sensor unit having a Faraday element which is sensitive to magnetic fields.

14. A configuration for processing a signal having a number of frequency ranges, comprising:

a divider circuit receiving and dividing at least one successor signal into a DC component and a residual component, the successor signal derived from two electrical signals of an optical transducer for an alternating electrical quantity and the successor signal corresponding to an analog signal;

an analog amplifier disposed downstream of said divider circuit and receiving the residual component, said analog amplifier having an analog gain factor and generating an amplified residual component from the residual component;

digitizing devices receiving the amplified residual component and the two electrical signals, said digitizing devices generating digital electrical signals and a digital amplified residual component from the two electrical signals and the amplified residual component, respectively; and a digital calculating unit for determining a digital polarization signal and connected to said digitizing devices, the digital polarization signal being dependent on the alternating electrical quantity to be measured, the digital polarization signal derived from the digital electrical signals, the digital amplified residual component, a digital DC component corresponding to the DC component, and a digital gain factor corresponding to the analog gain factor.

15. The configuration according to claim 14, wherein said divider circuit includes a low-pass filter which outputs the DC component of the successor signal, and a complimentary high-pass filter which outputs the residual component of the successor signal.

16. The configuration according to claim 14, wherein said divider circuit includes a low-pass filter which supplies the DC component of the successor signal, and a summing element which supplies the residual component of the successor signal by summation of the successor signal and an inverted DC component derived from the DC component.

17. The configuration according to claim 14, wherein said divider circuit includes an adjustable offset source outputting an output signal being the DC component of the successor signal, and a summing element supplying the residual component of the successor signal by summation of the successor signal and an inverted DC component derived from the DC component.

18. The configuration according to claim 14, including a summing element for forming the successor signal being a difference between the two electrical signals, said summing element connected to said divider circuit and said digitizing devices.

19. The configuration according to claim 15, including a further digitizing device connected to the divider circuit and receiving the DC component, said further digitizing device generating the digital DC component from the DC component.

20. The configuration according to claim 14, which comprises including:

a sensor element outputting a light signal;

an analyzer connected to said sensor element and dividing the light signal into two partial light signals with mutually perpendicular polarization; and two photo-electric transducer units disposed downstream of said sensor element and said analyzer, each of said two photo-electric transducer units generating one of the two electrical signals from one of the two partial light signals.

21. The configuration according to claim 20, wherein said sensor element is selected from the group consisting of Faraday elements sensitive to magnetic fields and Pockels elements sensitive to an electric field.

22. The configuration according to claims 14, including:

a sensor element containing a Faraday element sensitive to magnetic fields;

a first photo-electric transducer unit;

a second photo-electric transducer unit; and devices, one of said devices disposed between said sensor element and said first photo-electric transducer unit and another of said devices disposed between said sensor element and said second photo-electric transducer unit, said devices injecting oppositely directed first and second light signals into said sensor element and into said first and second photo-electric transducer unit for generating in each case one of the two electrical signals from in each case one of the first and second light signals.

\* \* \* \* \*